United States Patent
Eissa et al.

(10) Patent No.: US 8,288,283 B2
(45) Date of Patent: Oct. 16, 2012

(54) ALUMINUM ENHANCED PALLADIUM CMP PROCESS

(75) Inventors: Mona M. Eissa, Allen, TX (US); Brian E. Zinn, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/308,108

(22) Filed: Nov. 30, 2011

(65) Prior Publication Data

US 2012/0142183 A1    Jun. 7, 2012

Related U.S. Application Data

(60) Provisional application No. 61/420,423, filed on Dec. 7, 2010.

(51) Int. Cl.
  *H01L 21/461* (2006.01)
  *H01L 21/302* (2006.01)
(52) U.S. Cl. ........ 438/693; 438/612; 438/686; 438/692; 257/E21.585
(58) Field of Classification Search .................. 438/612, 438/686, 692, 693
  See application file for complete search history.

(56) References Cited

U.S. PATENT DOCUMENTS

| | | | |
|---|---|---|---|
| 6,527,622 B1 * | 3/2003 | Brusic et al. | 451/28 |
| 2003/0194879 A1 * | 10/2003 | Small et al. | 438/753 |
| 2005/0194358 A1 * | 9/2005 | Chelle | 216/88 |
| 2006/0024967 A1 * | 2/2006 | De Rege Thesauro et al. | 438/692 |
| 2007/0232068 A1 * | 10/2007 | Minamihaba et al. | 438/692 |
| 2008/0254629 A1 * | 10/2008 | Chang et al. | 438/693 |
| 2009/0075566 A1 * | 3/2009 | White et al. | 451/37 |
| 2011/0177690 A1 * | 7/2011 | Minami et al. | 438/693 |
| 2011/0237079 A1 * | 9/2011 | Kim et al. | 438/693 |
| 2012/0100718 A1 * | 4/2012 | Minami et al. | 438/693 |

* cited by examiner

*Primary Examiner* — Alexander Ghyka
(74) *Attorney, Agent, or Firm* — Jacqueline J. Garner; Wade J. Brady, III; Frederick J. Telecky, Jr.

(57) ABSTRACT

A process of forming an integrated circuit using a palladium CMP operation in which 25 to 125 ppm aluminum is added to the CMP slurry, allowing a palladium removal rate of at least 80 nanometers per minute at a polish pad pressure less than 9 psi and a surface speed between 1.9 and 2.2 meters per second. The palladium CMP operation may be applied to form a palladium bond pad cap after which an external bond element is formed on the palladium bond pad cap. Alternatively, the palladium CMP operation may be applied to form a palladium interconnect conductor in a first dielectric layer.

20 Claims, 6 Drawing Sheets

ALUMINUM ENHANCED PALLADIUM CMP PROCESS

FIELD OF THE INVENTION

This invention relates to the field of integrated circuits. More particularly, this invention relates to fabrication processes for integrated circuits.

BACKGROUND OF THE INVENTION

An integrated circuit may contain a palladium layer in the interconnect region, for example as a cap layer of a bond pad at the top surface of the integrated circuit, or as an interconnect element in the interconnect region. The palladium layer may be formed by forming a palladium layer in a recess and on an existing top surface of the integrated circuit, followed by a chemical mechanical polish (CMP) operation to remove unwanted palladium from the top surface, leaving palladium in the recess. Attaining desired removal rates of palladium using a CMP operation may require polish pad pressures and speeds which may undesirably reduce pad life and increase fabrication cost of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed using a palladium CMP operation. The CMP operation includes forming a palladium CMP slurry containing between 25 and 125 parts per million (ppm) of aluminum at a pH between 2.0 and 3.0, and polishing a palladium layer at a surface of the integrated circuit at a pad pressure less than 9 pounds per square inch (psi) at a surface speed between 1.9 and 2.2 meters per second, with a palladium removal rate of more than 80 nanometers per minute.

DETAILED DESCRIPTION

Figure 1A:
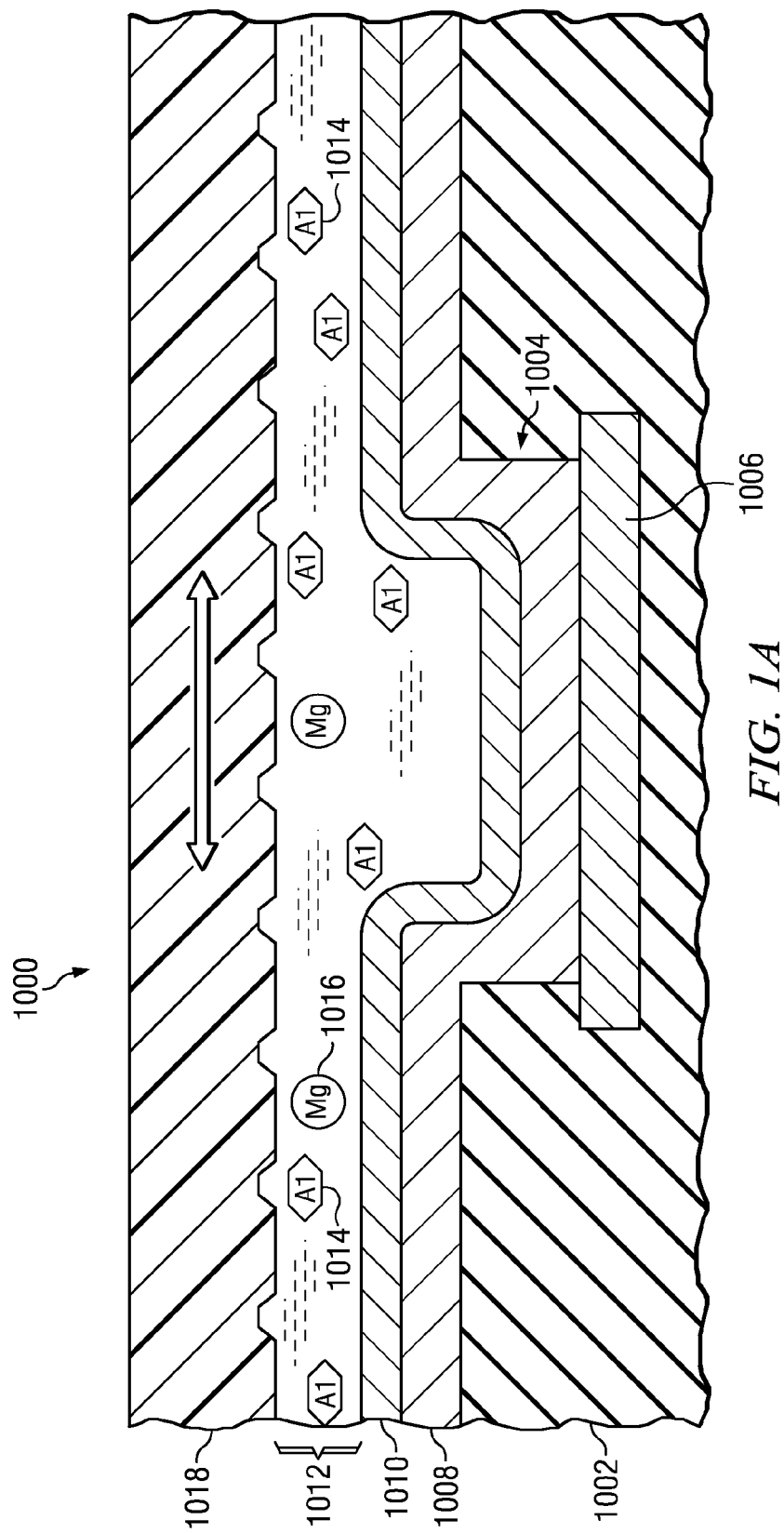
FIG. 1A through FIG. 1C are cross-sections of an integrated circuit formed according to the first embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present invention is a palladium CMP operation that includes forming a palladium CMP slurry containing between 25 and 125 parts per million (ppm) of aluminum at a pH between 2.0 and 3.0, and polishing the integrated circuit at a pad pressure less than 9 pounds per square inch (psi) at a surface speed between 1.9 and 2.2 meters per second, with a palladium removal rate of more than 80 nanometers per minute. In a first embodiment, an integrated circuit may be formed by a process of forming a dielectric layer on the integrated circuit, forming a bond pad recess in the dielectric layer, forming a palladium layer over the dielectric layer and in the bond pad recess, and removing the palladium over the dielectric layer with a CMP operation that leaves a palladium bond pad cap in the bond pad recess. The CMP operation includes forming a palladium CMP slurry containing between 25 and 125 parts per million (ppm) of aluminum at a pH between 2.0 and 3.0, and polishing the integrated circuit at a pad pressure less than 9 pounds per square inch (psi) at a surface speed between 1.9 and 2.2 meters per second, with a palladium removal rate of more than 80 nanometers per minute. Subsequently, an external bond element such as a solder bump or a ball bond is formed on the palladium bond pad cap.

In a second embodiment, an integrated circuit may be formed by a process of forming a first dielectric layer in an interconnect region of the integrated circuit, forming an interconnect recess, such as an interconnect trench, in the first dielectric layer, forming a palladium layer over the first dielectric layer and in the interconnect recess, and removing the palladium over the first dielectric layer with a CMP operation that leaves a palladium interconnect element in the interconnect recess. Subsequently, a second dielectric layer is formed over the first dielectric layer and the palladium interconnect element, and a second interconnect element is formed in the second dielectric layer to contact the palladium interconnect element.

Figure 1B:
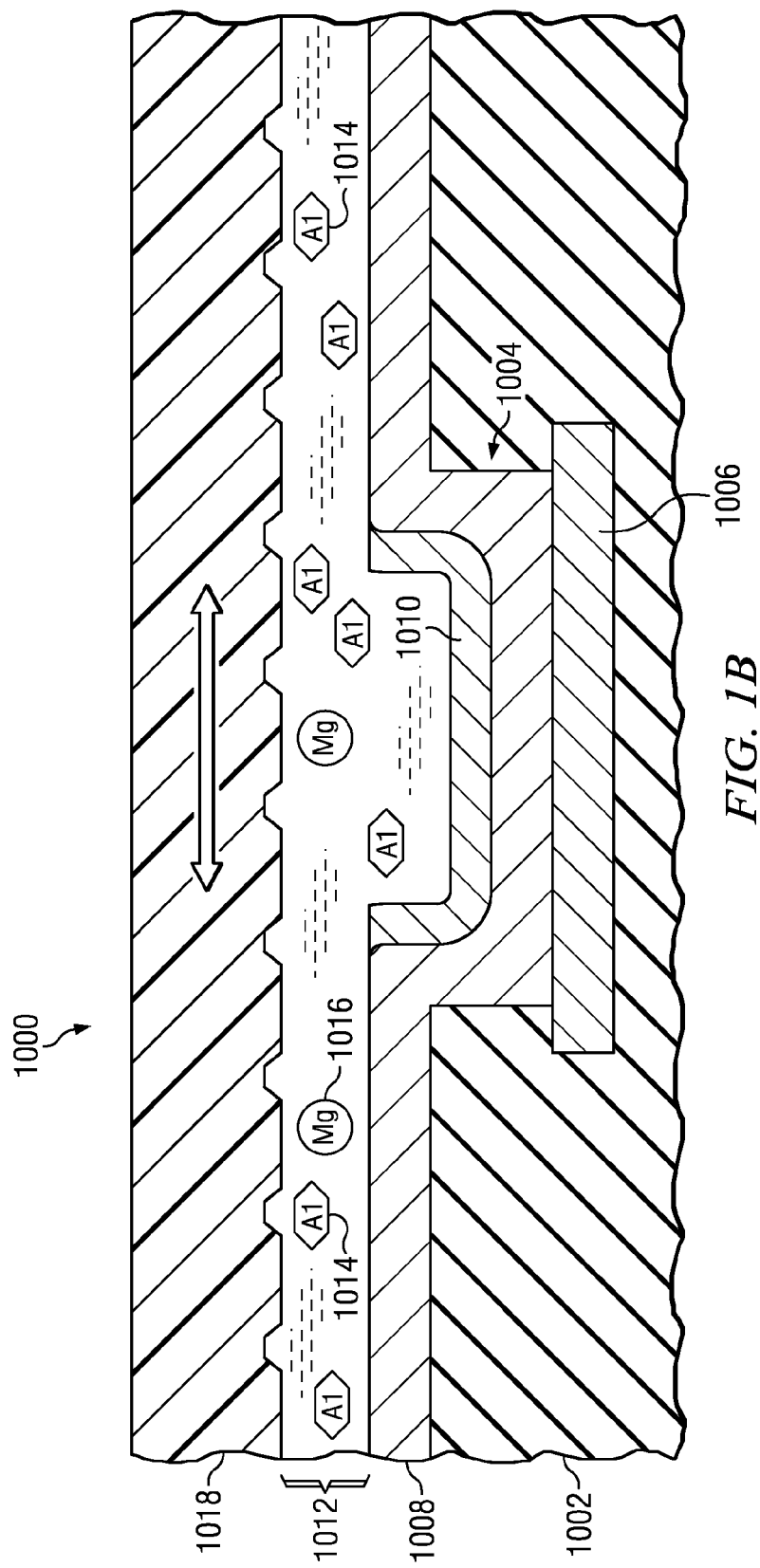
Figure 1C:
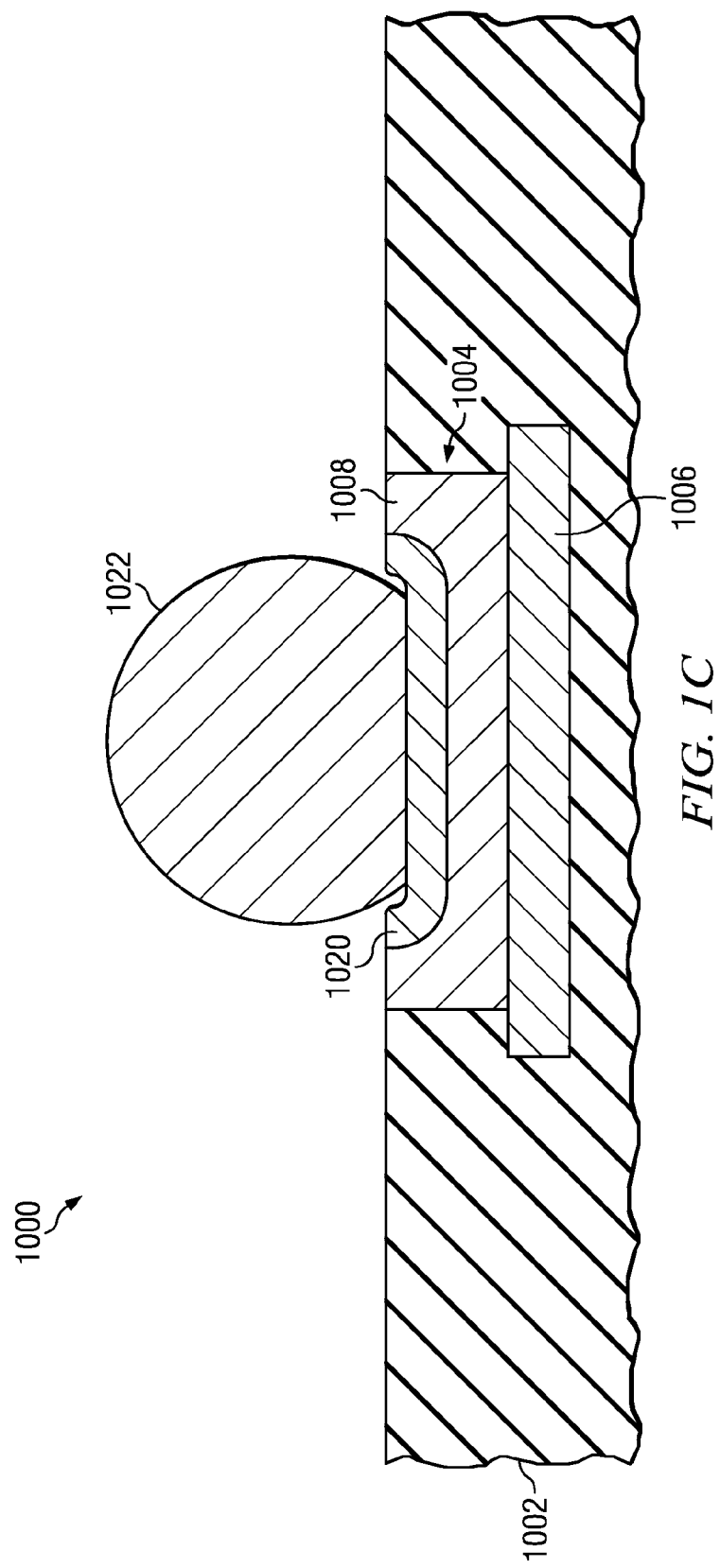

FIG. 1A through FIG. 1C are cross-sections of an integrated circuit formed according to the first embodiment, depicted in successive stages of fabrication. Referring to FIG. 1A, the integrated circuit 1000 includes a dielectric layer 1002 at an existing top surface of the integrated circuit 1000 formed as part of an interconnect region of the integrated circuit 1000. A bond pad recess 1004 is formed at a top surface of the dielectric layer 1002, possibly exposing an interconnect element 1006 in the interconnect region. An optional metal underlayer 1008 may be formed on the top surface of the dielectric layer 1002 and in the bond pad recess 1004. A layer of palladium 1010 is formed over the top surface of the dielectric layer 1002 and in the bond pad recess 1004. In one version of the instant embodiment, the metal underlayer 1008 may be omitted and the palladium layer 1010 may be between 300 and 60 nanometers thick. In another version, the metal underlayer 1008 may be nickel between 300 and 500 nanometers thick and the palladium layer 1010 may be between 100 and 200 nanometers thick. In a further version, the metal underlayer 1008 may be nickel between 600 and 1000 nanometers thick and the palladium layer 1010 may be between 150 and 300 nanometers thick. In yet another version, the metal underlayer 1008 may be nickel between 1000 and 2000 nanometers thick and the palladium layer 1010 may be between 150 and 300 nanometers thick.

A palladium CMP operation is performed on the integrated circuit 1000. In one version of the instant embodiment, a starting mixture for a palladium CMP slurry 1012 may be formed by adding between 1 and 6 percent of an abrasive powder such as silica or ceria to an aqueous solution of 3 to 15 percent oxycarboxylic acid ether. In another version of the instant embodiment, the starting mixture for the palladium CMP slurry 1012 may be formed by adding between 0.5 and 20 percent of the abrasive powder to an aqueous solution of 1 to 20 percent glycol ether. A pH of the slurry 1012 is adjusted to between 2.0 and 3.0, for example by adding acid to the slurry 1012. Between 25 and 125 ppm aluminum 1014, referenced to the abrasive powder, is added to the slurry 1012. The aluminum 1014 may be in the form of aluminum powder, aluminum oxide powder, an aluminum salt such as aluminum chloride, or other form of aluminum which dissolves in the slurry 1012. In a further version of the instant embodiment, the aluminum 1014 in the slurry 1012 is between 50 and 100 ppm of the abrasive powder. Optionally, between 20 and 100 ppm of magnesium 1016 may be added to the slurry 1012.

The palladium CMP slurry 1012 is applied to a top surface of the palladium layer 1010. A CMP polishing pad 1018 is applied to the palladium CMP slurry 1012 over the integrated circuit 1000 at a pressure less than 9 psi and a surface speed between 1.9 and 2.2 meters per second. Palladium is removed from the palladium layer 1010 at a rate of at least 80 nanometers per minute.

Referring to FIG. 1B, the palladium CMP operation is continued until the palladium layer 1010 over the top surface of the dielectric layer 1002 is removed, leaving palladium of the palladium layer 1010 in the bond pad recess 1004.

Referring to FIG. 1C, the metal underlayer 1008, if formed, is removed from over the top surface of the dielectric layer 1002, for example by continuing the palladium CMP operation or by another CMP operation. The palladium in the bond pad recess 1004 forms a palladium bond pad cap 1020. An external bond element 1022 such as a solder bump, as depicted in FIG. 1C, or a ball bond or a beam lead, is formed on the palladium bond pad cap 1020. Forming other types of external bond elements on the palladium bond pad cap 1020 is within the scope of the instant embodiment.

Figure 2A:
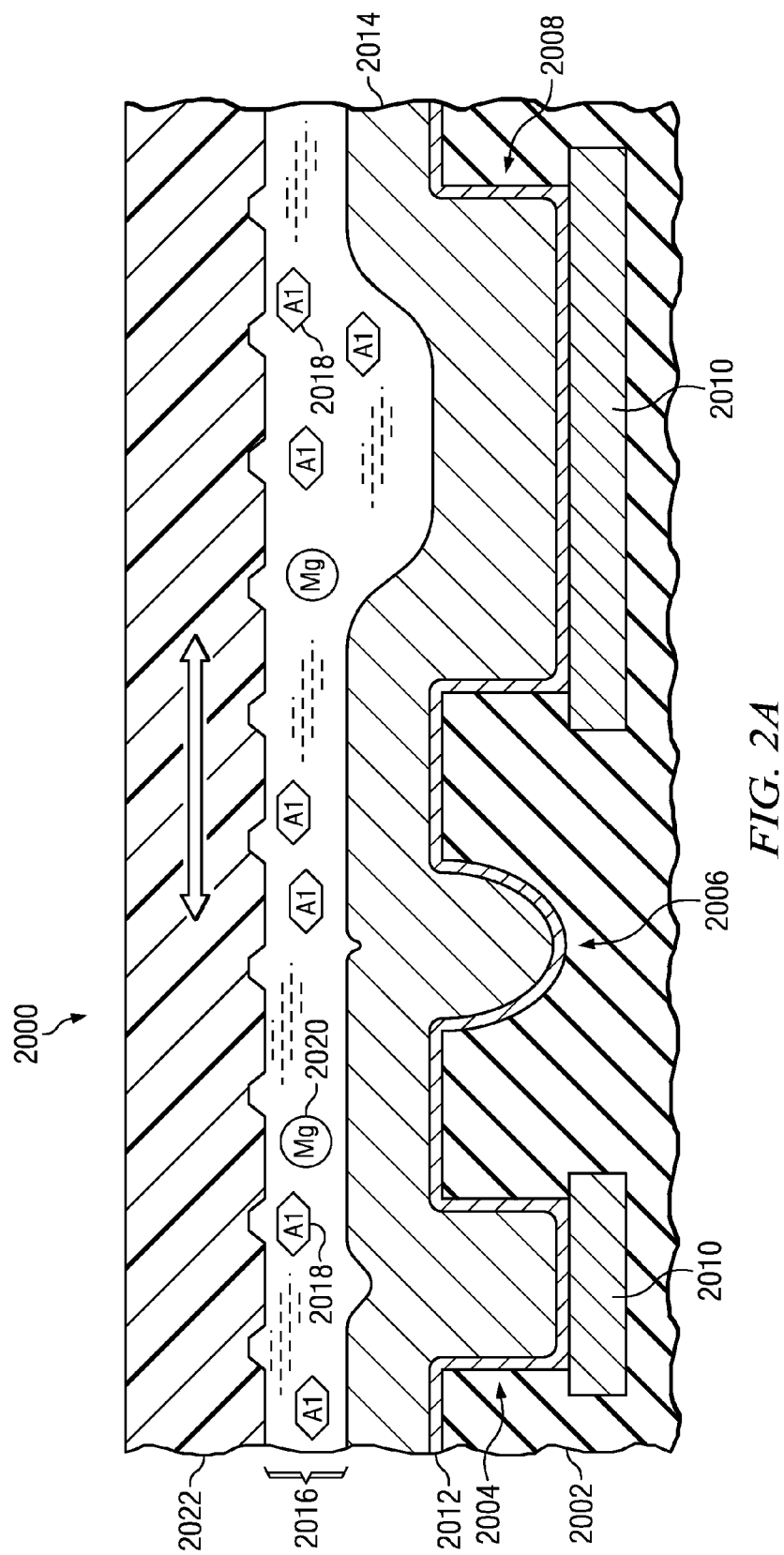
FIG. 2A through FIG. 2C are cross-sections of an integrated circuit formed according to the second embodiment, depicted in successive stages of fabrication.
Figure 2B:
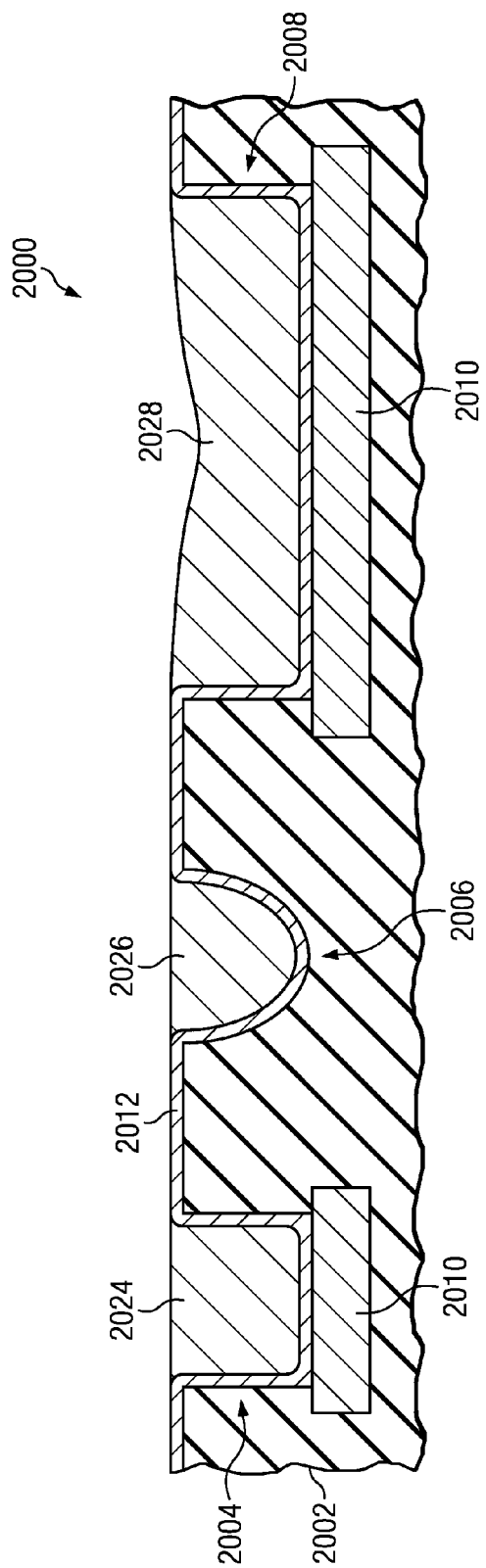
Figure 2C:
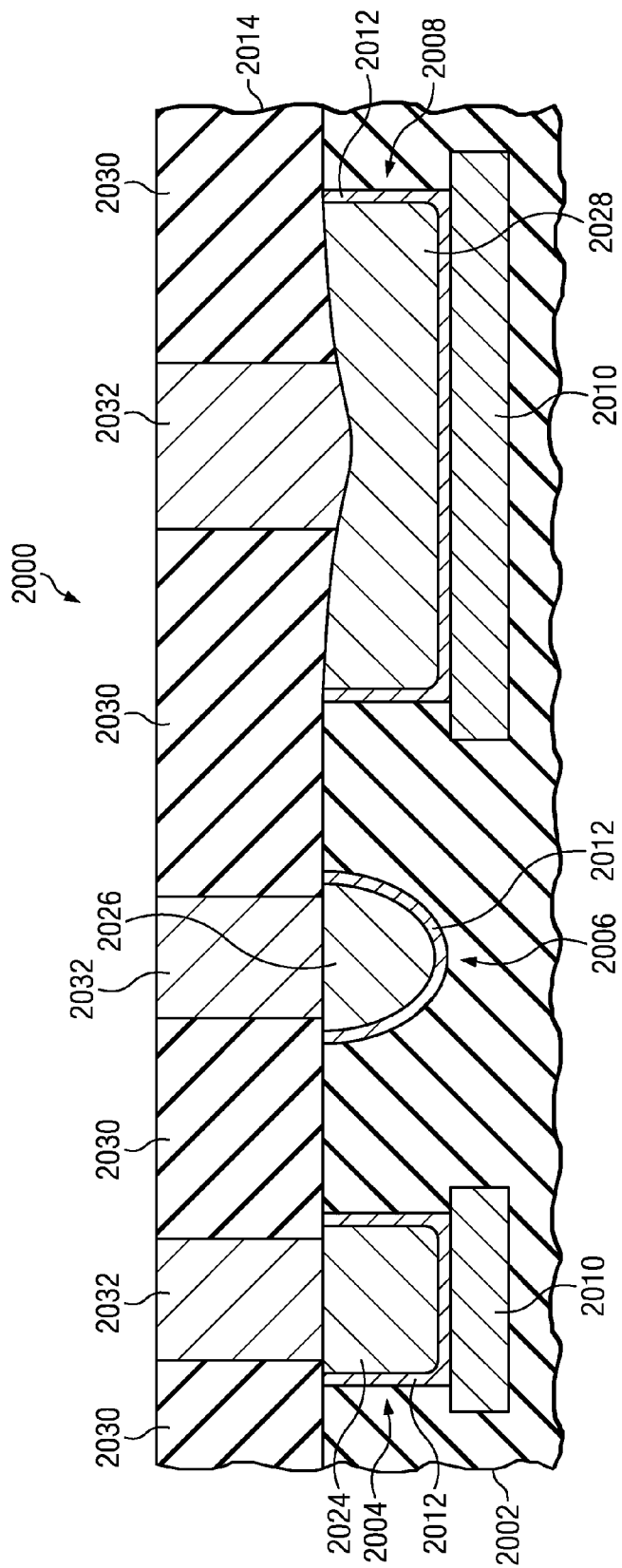

FIG. 2A through FIG. 2C are cross-sections of an integrated circuit formed according to the second embodiment, depicted in successive stages of fabrication. Referring to FIG. 2A, the integrated circuit 2000 includes a first dielectric layer 2002 formed as part of an interconnect region of the integrated circuit 2000. One or more interconnect conductor recesses 2004, 2006, 2008 are formed at a top surface of the first dielectric layer 2002, possibly exposing interconnect elements 2010 in the interconnect region. Profiles of the interconnect conductor recesses may be substantially rectangular as depicted in conductor recess 2004 or may be rounded as depicted in conductor recess 2006. An optional metal liner 2012 such as titanium, titanium nitride, tantalum, tantalum nitride, tungsten, or tungsten nitride, may be formed on the top surface of the first dielectric layer 2002 and in the interconnect conductor recesses 2004, 2006, 2008. A layer of palladium 2014 is formed over the top surface of the first dielectric layer 2002 and in the interconnect conductor recesses 2004, 2006, 2008. In one version of the instant embodiment, the palladium layer 2014 may be between 100 and 200 nanometers thick. One or more instances of the interconnect conductor recesses may be sufficiently wide that a top surface of the palladium layer 2014 in the wide interconnect conductor recess 2008 is lower than the top surface of the palladium layer 2014 over the top surface of the first dielectric layer 2002 by substantially a depth of the wide interconnect conductor recess 2008.

A palladium CMP slurry 2016 containing aluminum particles 2018 and possibly magnesium particles 2020 is formed as described in reference to FIG. 1A. The palladium CMP slurry 2016 is applied to the top surface of the palladium layer 2014. A CMP polishing pad 2022 is applied to the palladium CMP slurry 2016 over the integrated circuit 2000 at a pressure less than 9 psi and a surface speed between 1.9 and 2.2 meters per second. Palladium is removed from the palladium layer 2014 at a rate of at least 80 nanometers per minute.

Referring to FIG. 2B, the palladium CMP operation is continued until the palladium layer 2014 over the top surface of the first dielectric layer 2002 is removed, leaving palladium of the palladium layer in the interconnect conductor recesses 2004, 2006, 2008 to form palladium interconnect conductor elements 2024, 2026, 2028.

Referring to FIG. 2C, the metal liner 2012, if formed, is removed from over the top surface of the first dielectric layer 2002, for example by continuing the palladium CMP operation, by another CMP operation, or by an etchback operation. A second dielectric layer 2030 is formed over the first dielectric layer 2002 and the interconnect conductor elements 2024, 2026, 2028. Optional conductor elements 2032, for example metal vias, may be formed in the second dielectric layer 2030 to make electrical contact to one or more instances of the interconnect conductor elements 2024, 2026, 2028.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising:
    forming a layer of palladium over an existing top surface of said integrated circuit;
    performing a palladium chemical mechanical polish (CMP) operation on said integrated circuit, by a process including:
        forming a palladium CMP slurry, said palladium CMP slurry including an abrasive powder in an aqueous solution and 25 to 125 parts per million (ppm) aluminum, referenced to said abrasive powder, such that a pH of said palladium CMP slurry is between 2.0 and 3.0;
        applying said slurry to a top surface of said palladium layer;
    adjusting a CMP polish pad to provide a pressure of less than 9 pounds per square inch (psi) and a surface speed between 1.9 and 2.2 meters per second, so that palladium is removed at a rate of at least 80 nanometers per minute.

2. The process of claim 1, in which said aluminum in said CMP slurry is between 50 and 75 ppm, referenced to said abrasive powder.

3. The process of claim 1, in which said aluminum is in the form of aluminum powder.

4. The process of claim 1, in which said aluminum is in the form of aluminum oxide powder.

5. The process of claim 1, in which said aluminum is in the form of an aluminum salt.

6. The process of claim 1, in which said palladium CMP slurry further includes 25 to 100 ppm magnesium, referenced to said abrasive powder.

7. The process of claim 1, in which said abrasive powder is silica.

8. The process of claim 1, in which said aqueous solution includes between 3 and 15 percent oxycarboxylic acid ether.

9. The process of claim 1, in which said aqueous solution includes between 1 and 20 percent glycol ether.

10. The process of claim 1 further comprising:
providing a dielectric layer at the existing top surface of said integrated circuit;
forming a bond pad recess in said dielectric layer; wherein said layer of palladium is located in said bond pad recess and over said dielectric layer and wherein said step of performing the palladium CMP operation removes said palladium from a top surface of said dielectric layer, leaving palladium in said bond pad recess to form a palladium bond pad cap; and
forming an external bond element on said palladium bond pad cap.

11. The process of claim 10;
further including forming a metal underlayer of nickel between 300 and 500 nanometers thick over said dielectric layer and in said bond pad recess, performed prior to said step of forming said layer of palladium; and
in which said layer of palladium id between 100 and 200 nanometers thick.

12. The process of claim 1, further comprising the steps of:
providing a first dielectric layer in an interconnect region of said integrated circuit;
forming an interconnect conductor recess in said first dielectric layer, wherein layer of said palladium is located in said interconnect conductor recess and over said first dielectric layer and wherein said palladium CMP operation removes said palladium from said top surface of said first dielectric layer, leaving palladium in said interconnect conductor recess to form a palladium interconnect conductor element; and
forming second dielectric layer over said first dielectric layer and said palladium interconnect conductor element.

13. The process of claim 12, further including forming a metal liner over said first dielectric layer and in said interconnect conductor recess, performed prior to said step of forming said layer of palladium.

14. A process of forming an integrated circuit, comprising:
providing a dielectric layer at an existing top surface of said integrated circuit;
forming a bond pad recess in said dielectric layer;
forming a layer of palladium over said dielectric layer, so that said palladium is located in said bond pad recess and over said dielectric layer;
performing a palladium chemical mechanical polish (CMP) operation on said integrated circuit, by a process including:
forming a palladium CMP slurry, said palladium CMP slurry including an abrasive powder in an aqueous solution and 25 to 125 parts per million (ppm) aluminum, referenced to said abrasive powder, such that a pH of said palladium CMP slurry is between 2.0 and 3.0;
applying said slurry to a top surface of said palladium layer;
adjusting a CMP polish pad to provide a pressure of less than 9 pounds per square inch (psi) and a surface speed between 1.9 and 2.2 meters per second, so that palladium is removed at a rate of at least 80 nanometers per minute; and
removing said palladium from said top surface of said dielectric layer, leaving palladium in said bond pad recess to form a palladium bond pad cap; and
forming an external bond element on said palladium bond pad cap.

15. The process of claim 14, wherein said aluminum is selected from the group consisting of aluminum powder, aluminum oxide powder, and aluminum salt.

16. The process of claim 15, in which said palladium CMP slurry further includes 25 to 100 ppm magnesium, referenced to said abrasive powder.

17. A process of forming an integrated circuit, comprising:
providing a first dielectric layer in an interconnect region of said integrated circuit;
forming an interconnect conductor recess in said first dielectric layer;
forming a layer of palladium over said first dielectric layer, so that said palladium is located in said interconnect conductor recess and over said first dielectric layer;
performing a palladium chemical mechanical polish (CMP) operation on said integrated circuit, by a process including:
forming a palladium CMP slurry, said palladium CMP slurry including an abrasive powder in an aqueous solution and 25 to 125 parts per million (ppm) aluminum, referenced to said abrasive powder, such that a pH of said palladium CMP slurry is between 2.0 and 3.0;
applying said slurry to a top surface of said palladium layer;
adjusting a CMP polish pad to provide a pressure of less than 9 psi and a surface speed between 1.9 and 2.2 meters per second, so that palladium is removed at a rate of at least 80 nanometers per minute; and
removing said palladium from said top surface of said first dielectric layer, leaving palladium in said interconnect conductor recess to form a palladium interconnect conductor element; and
forming second dielectric layer over said first dielectric layer and said palladium interconnect conductor element.

18. The process of claim 17, in which said aluminum is selected from the group consisting of aluminum powder, aluminum oxide powder, and aluminum salt.

19. The process of claim 17, in which said palladium CMP slurry further includes 25 to 100 ppm magnesium, referenced to said abrasive powder.

20. The process of claim 17, in which said abrasive powder is silica.

* * * * *